(12) United States Patent
Eun et al.

(10) Patent No.: US 8,049,199 B2
(45) Date of Patent: Nov. 1, 2011

(54) PHASE CHANGE MEMORY DEVICE AND METHOD FOR MANUFACTURING THE SAME

(75) Inventors: Yong Seok Eun, Ichon-si (KR); Su Jin Chae, Ichon-si (KR); Keum-Bum Lee, Ichon-si (KR); Heon-Yong Chang, Ichon-si (KR); Min-Yong Lee, Ichon-si (KR)

(73) Assignee: Hynix Semiconductor Inc. (KR)

( * ) Notice: Subject to any disclaimer, the term of this patent is extended or adjusted under 35 U.S.C. 154(b) by 346 days.

(21) Appl. No.: 12/169,612

(22) Filed: Jul. 8, 2008

(65) Prior Publication Data

US 2009/0045389 A1 Feb. 19, 2009

(30) Foreign Application Priority Data

Aug. 14, 2007 (KR) .................. 10-2007-0081556

(51) Int. Cl.
*H01L 47/00* (2006.01)
*H01L 21/00* (2006.01)

(52) U.S. Cl. ............. 257/4; 257/E27.104; 257/E47.001

(58) Field of Classification Search .............. 257/4, 379, 257/E47.001, E21.001, 2, 3, 5, E27.104; 365/148
See application file for complete search history.

(56) References Cited

U.S. PATENT DOCUMENTS

2006/0091476 A1* 5/2006 Pinnow et al. ................ 257/379
2007/0152205 A1* 7/2007 Chen ................................ 257/4

FOREIGN PATENT DOCUMENTS

KR 1020050059400 A 6/2005
KR 1020070079647 A 8/2007

* cited by examiner

*Primary Examiner* — Thomas L Dickey
*Assistant Examiner* — Fazli Erdem
(74) *Attorney, Agent, or Firm* — Baker & McKenzie LLP (57) ABSTRACT

A phase change memory device and a method for manufacturing the same. The method includes the steps of defining bottom electrode contact holes by removing portions of an insulation layer, to expose bottom electrodes, on a semiconductor substrate on which the bottom electrodes and the insulation layer are sequentially formed; forming amorphous silicon spacers on inner sidewalls of the bottom electrode contact holes; and forming bottom electrode contacts in the bottom electrode contact holes.

3 Claims, 8 Drawing Sheets

PHASE CHANGE MEMORY DEVICE AND METHOD FOR MANUFACTURING THE SAME

RELATED APPLICATION INFORMATION

This application claims the benefit under 35 U.S.C. 119(a) of Korean Patent Application No. 10-2007-0081556, filed on Aug. 14, 2007, in the Korean Intellectual Property Office, the disclosure of which is incorporated herein in its entirety by reference as if set forth in full.

BACKGROUND

1. Technical Field

The embodiments described herein relate to a phase change memory device, and more particularly, to a phase change memory device in which the effect of increasing the height of a bottom electrode contact is accomplished to minimize the reset current of the phase change memory device and a method for manufacturing the same.

2. Related Art

A conventional phase change memory device is a memory device that writes and reads information through the phase change of a phase change material, which has high resistance in an amorphous state and a low resistance in a crystalline state. A phase change memory device has advantages in that it has a rapid operation speed and a high level of integration when compared to a flash memory device.

In a conventional phase change memory device, the reversible phase change of the phase change material occurs by Joule heating that is produced by externally applied electric pulses. The procedures for controlling the phase of the phase change material are called set and reset procedures. In the reset procedure, after locally heating and melting the phase change material in the crystalline state to a temperature above a melting point by applying short and high pulses, the phase of the phase change material is changed to the amorphous state using a quenching phenomenon due to a great temperature difference from the surrounding environment. On the other hand, in the set procedure, by applying relatively long and low pulses, the phase change material in the amorphous state is changed to the crystalline state.

The amount of current produced in the set and reset procedures of a conventional phase change memory device determines the lifetime, the sensing margin and the shrinkage rate of the phase change memory device. Therefore, in order to ensure the reliable operation of the phase change material using a low reset current level, the methods of decreasing the contact area between a bottom electrode contact (BEC) and the phase change material or increasing the resistance of the BEC through increasing the height of the BEC have been considered.

Currently, as a way of decreasing the contact area between the BEC and the phase change material so as to minimize the reset current, a method of forming a BEC into the shape of a cylinder has been disclosed. This method will be described below with reference to FIGS. 1 and 2.

Figure 1:
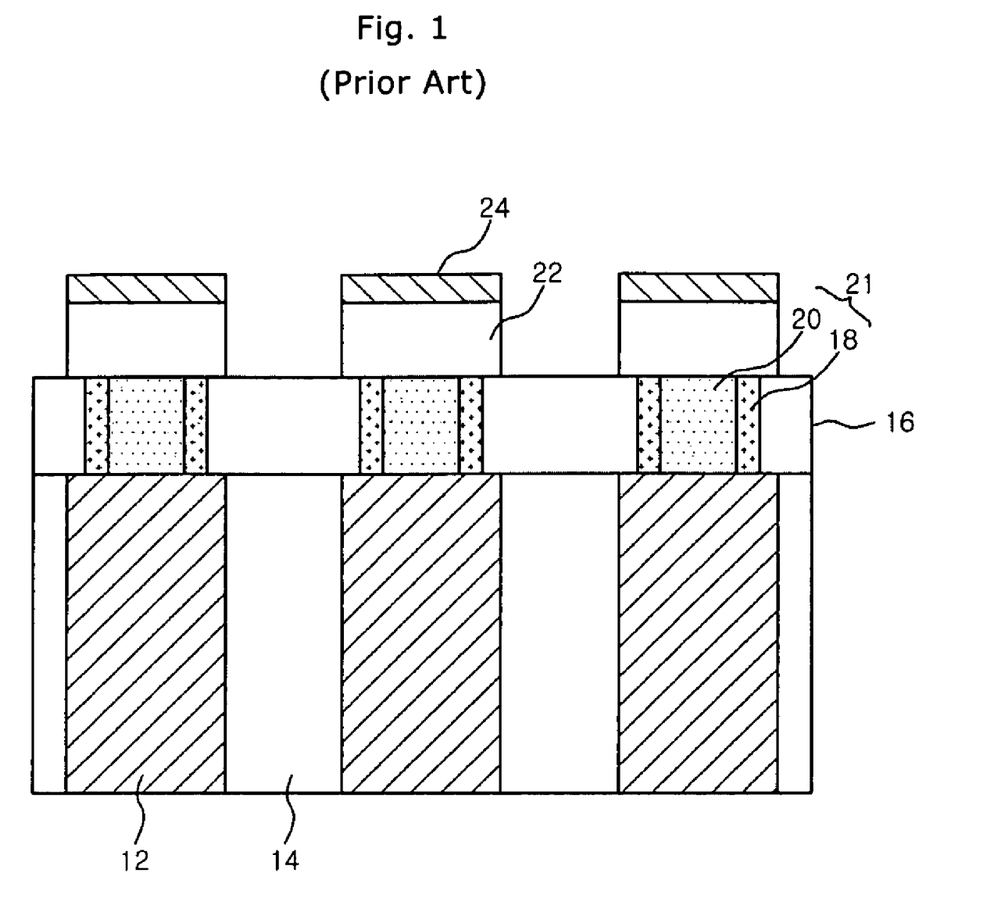
FIG. 1 is a sectional view illustrating a conventional phase change memory device.
Figure 2:
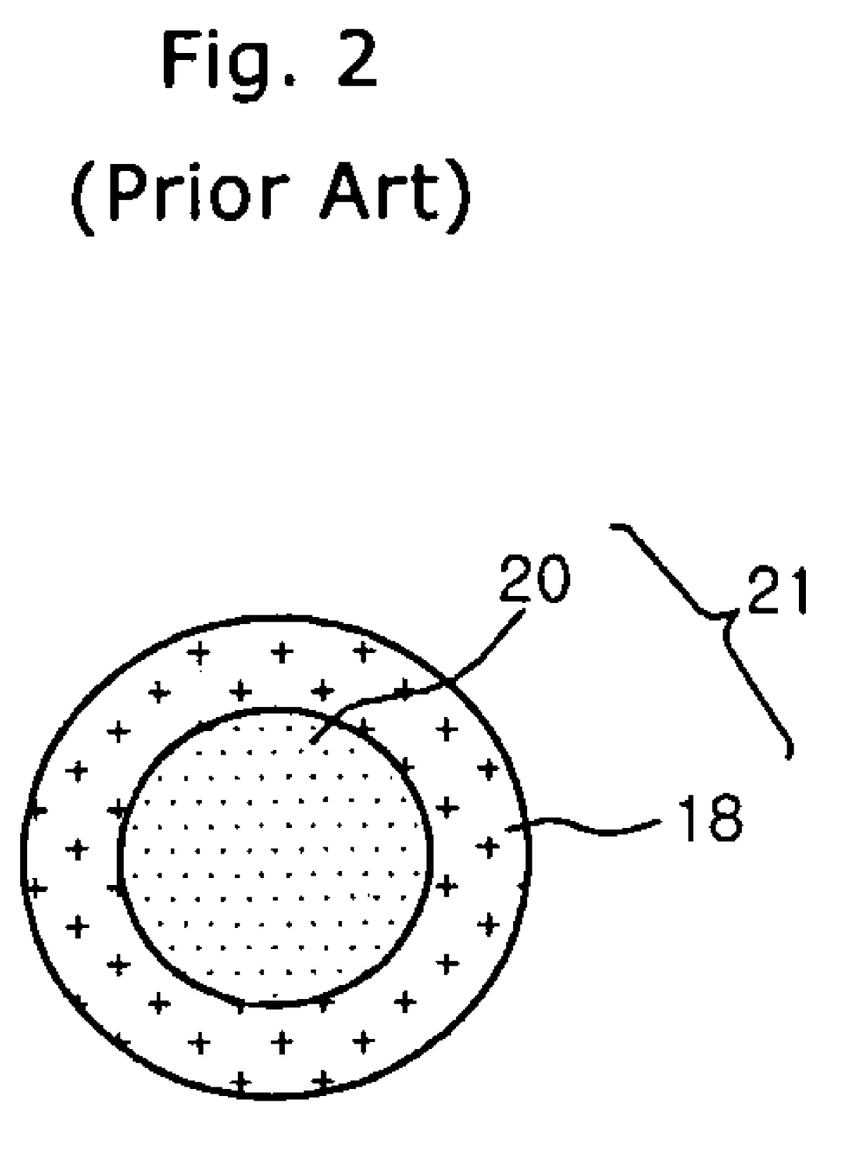
FIG. 2 is a plan view illustrating the bottom electrode contact shown in FIG. 1.

FIG. 1 is a sectional view illustrating a conventional phase change memory device, and FIG. 2 is a plan view illustrating the BEC shown in FIG. 1.

Referring to FIG. 1, an insulation layer 16 is formed on bottom electrodes 12. After defining BEC holes to have a circular transverse sectional shape by patterning the insulation layer 16, a conductive material 18 is applied onto the resultant entire structure. Thereupon, by etching the conductive material 18 such that the conductive material 18 remains only on the sidewalls of the BEC holes, the surfaces of the bottom electrodes are exposed. Then, by filling the BEC holes with a dielectric material 20, BECs 21 are formed. Next, a phase change material layer 22 and top electrodes 24 are sequentially formed on the BECs 21. In FIG. 1, the unexplained numeral 14 designates an interlayer dielectric.

FIG. 2 is a plan view illustrating a state in which the conductive material 18 and the dielectric material 20 are filled in the BEC holes after defining the BEC holes to have the circular transverse sectional shape by patterning the insulation layer 16. As shown in FIG. 2, each BEC 21 may be composed of the dielectric material 20 which has the shape of a circular column and the conductive material 18 which has the shape of a ring surrounding the circumferential outer surface of the dielectric material 20.

As described above, by forming the BEC 21 to have the shape of a cylinder and filling the inside of the BEC 21 with the dielectric material 20, the contact area between the BEC 21 and the phase change material layer 22 can be minimized and according to this, the reset current can be decreased.

However, limitations necessarily exist in decreasing the reset current only by reducing the contact area between the BEC 21 and the phase change material layer 22. In this regard, if the height of the BEC 21 can be increased while minimizing the contact area between the BEC 21 and the phase change material layer 22, the reset current can be more effectively decreased.

Since the height of the BEC 21 is determined by the definition of a process, the height of the BEC 21 varies depending upon a lithography process and an etching process for defining the BEC holes. However, in the current semiconductor manufacturing technologies, when considering the sectional area of the bottom electrode 12 and the thickness of the insulation layer 16, the height of the BEC 21 cannot be properly controlled less than the aspect ratio of 1.2. Therefore, limitations also necessarily exist in decreasing the reset current of the phase change memory device through controlling the height of the BEC 21, and therefore, a limit is imposed on the shrinkage margin of the phase change memory device.

SUMMARY

A phase change memory device in which a conductive material is applied after increasing the surface area of the inner sidewalls of bottom electrode contacts to be formed so as to obtain the effect of increasing the height of the bottom electrode contacts, and a method for manufacturing the same are described herein.

A phase change memory device in which the effect of increasing the height of bottom electrode contacts is accomplished to minimize the reset current of the phase change memory device so that a process margin can be secured, and a method for manufacturing the same.

According to one aspect, there is provided a method for manufacturing a phase change memory device having switching elements and storage nodes which come into contact with the switching elements, the method comprising the steps of defining bottom electrode contact holes by removing portions of an insulation layer, to expose bottom electrodes, on a semiconductor substrate on which the bottom electrodes and the insulation layer are sequentially formed; forming amorphous silicon spacers on inner sidewalls of the bottom electrode contact holes; and forming bottom electrode contacts in the bottom electrode contact holes.

According to another aspect, there is provided a method for manufacturing a phase change memory device having switching elements and storage nodes which come into contact with the switching elements, the method comprising the steps of defining bottom electrode contact holes by slopingly etching portions of an insulation layer, to expose bottom electrodes, on a semiconductor substrate on which the bottom electrodes and the insulation layer are sequentially formed; and forming bottom electrode contacts in the bottom electrode contact holes by filling the bottom electrode contact holes with a conductive material layer and a dielectric material layer.

According to another aspect, there is provided a phase change memory device comprising a semiconductor substrate; bottom electrodes formed on the semiconductor substrate; bottom electrode contacts including cylinder-shaped hemispherical spacers which extend from the bottom electrodes in a lengthwise direction and a conductive material layer which is formed on hemispherical surfaces of the spacers and comes into contact with the bottom electrodes; and a phase change material layer formed on the bottom electrode contacts.

According to still another aspect, there is provided a phase change memory device comprising a semiconductor substrate; bottom electrodes formed on the semiconductor substrate; bottom electrode contacts including cylinder-shaped spacers which extend from the bottom electrodes in a lengthwise direction and a conductive material layer which is formed on the spacers and comes into contact with the bottom electrodes; and a phase change material layer formed on the bottom electrode contacts.

According to a still further aspect, there is provided a phase change memory device comprising a semiconductor substrate; bottom electrodes formed on the semiconductor substrate; bottom electrode contacts including a conductive material layer and a dielectric material layer, which comes into contact with the bottom electrodes; an insulation layer formed between the bottom electrode contacts and having different diameters on upper ends and lower ends of the bottom electrode contacts; and a phase change material layer formed on the bottom electrode contacts to contact with the conductive material layer; wherein the conductive material layer is formed on sidewall and lower portion of the dielectric material layer.

BRIEF DESCRIPTION OF THE DRAWINGS

Features, aspects, and embodiments are described in conjunction with the attached drawings, in which.

DETAILED DESCRIPTION

FIGS. 3a through 3i are sectional views sequentially explaining a method for manufacturing a phase change memory device in accordance with one embodiment.

The embodiments described herein are designed to accomplish the effect of increasing the height of a bottom electrode contact in a phase change memory device. A concrete manufacturing method will be described in relation to a procedure after switching elements (not shown) are formed on a semiconductor substrate and bottom electrodes connected with the switching elements via plugs (not shown) are formed.

Figure 3A:
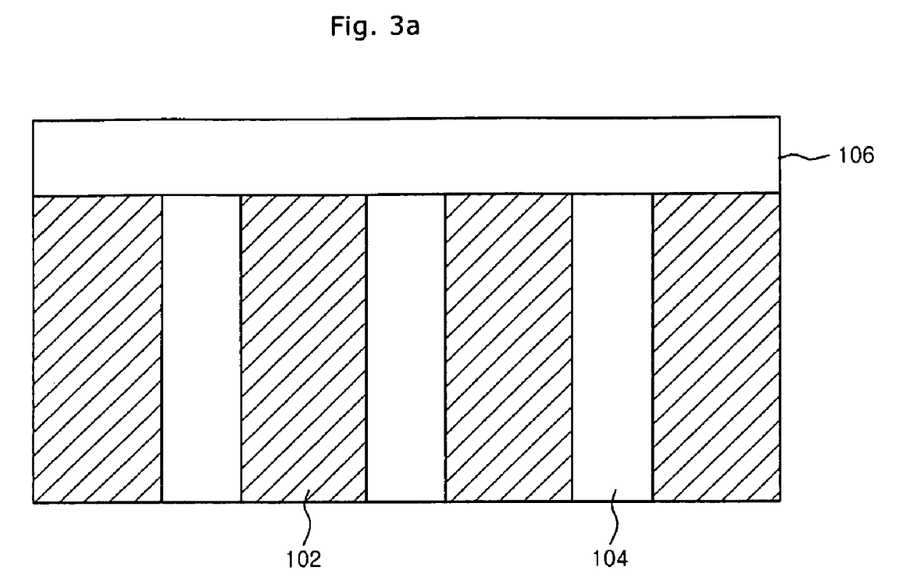
FIGS. 3a through 3i are sectional views sequentially explaining a method for manufacturing a phase change memory device in accordance with an embodiment.

First, referring to FIG. 3a, after preparing a semiconductor substrate (not shown), which is formed with an interlayer dielectric 104 and bottom electrodes 102, an insulation layer 106 is formed on the resultant entire structure.

Figure 3B:
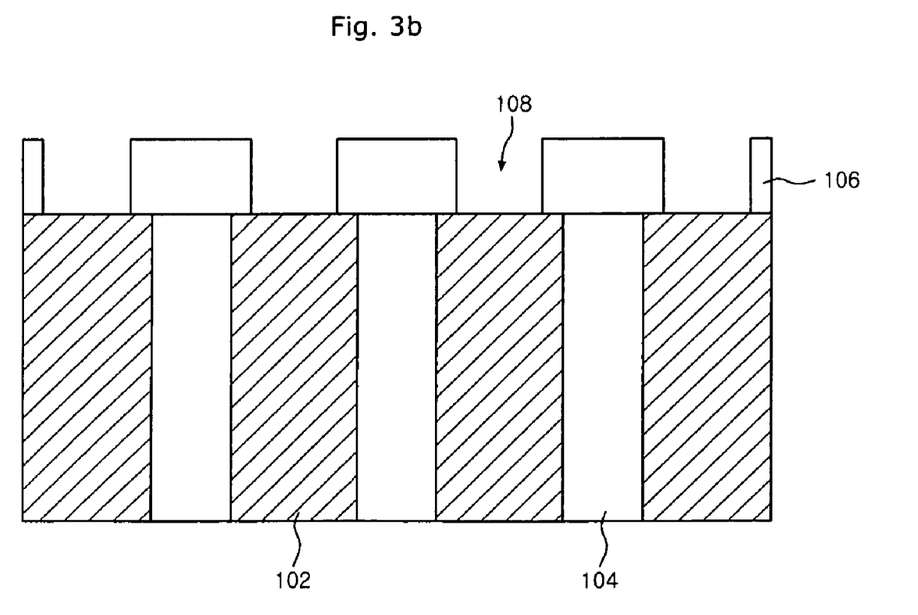

Referring to FIG. 3b, by patterning the preset portions of the insulation layer 106, bottom electrode contact holes (BEC holes) 108 are defined to expose the surfaces of the bottom electrodes 102. It is preferred that the insulation layer 106 be deposited to a thickness of 500~1,200 Å and the BEC holes 108 be defined to have a circular transverse sectional shape. Also, it is preferred that lithography and etching processes for defining the BEC holes 108 be controlled such that the critical dimension of the bottom surfaces of the BEC holes is 40~70 nm. The thickness of the insulation layer 106 may be the same as that of an insulation layer which is formed in the manufacture of a conventional phase change memory device.

Meanwhile, it may be preferred that the insulation layer 106 be patterned through a sloped etching process. In this case, since the diameter of the BEC holes defined through patterning of the insulation layer 106 is greater at the upper ends than the lower ends of the BEC holes, the effect of increasing the substantial height of the BEC holes is accomplished. Also, in the case of patterning the insulation layer 106 through the sloped etching process, because the effect of increasing the substantial height of the BEC holes is accomplished, resistance can be increased even without forming spacers on the sidewalls of the BEC holes.

Figure 3C:
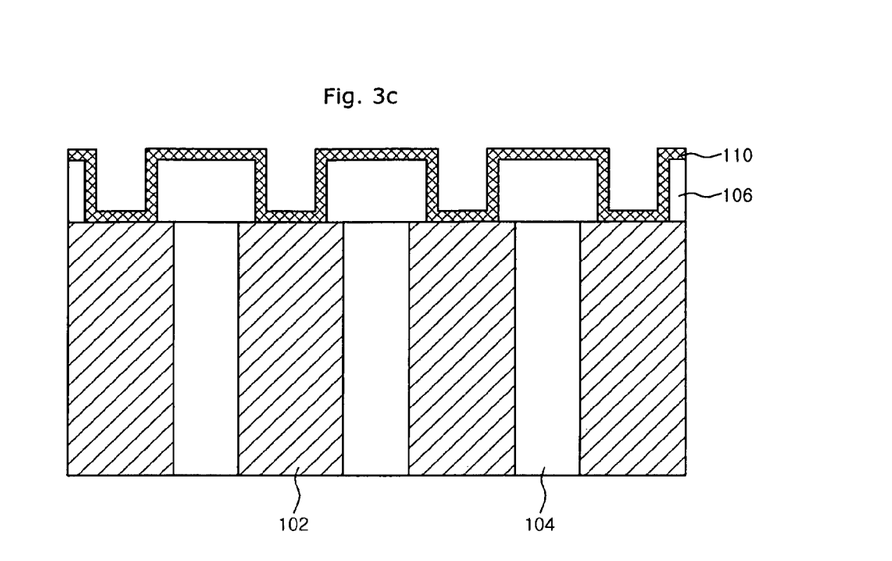
Figure 3D:
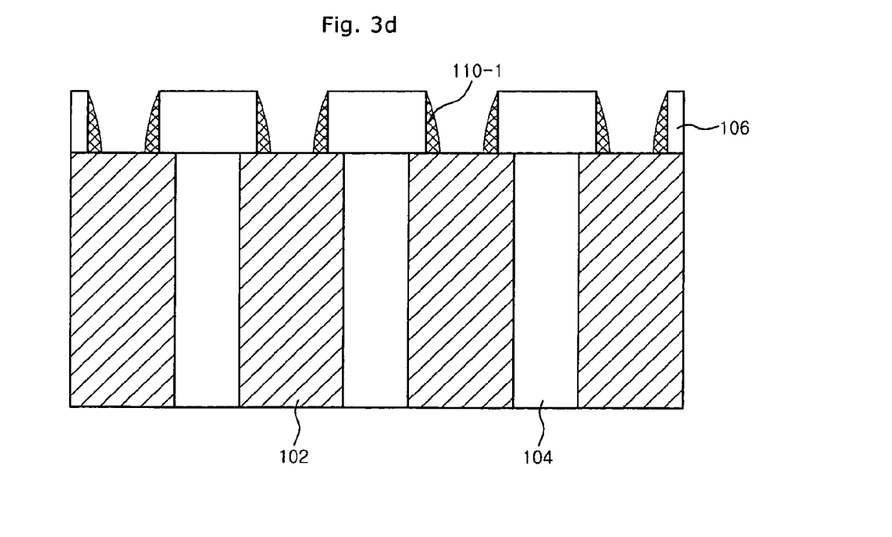

Referring to FIG. 3c, an amorphous silicon layer 110 is formed on the resultant entire structure. Then, by implementing an etching process such that the amorphous silicon layer 110 remains only on the inner sidewalls of the BEC holes, amorphous silicon spacers 110-1 having the shape of a cylinder as shown in FIG. 3d are formed.

In FIG. 3c, the amorphous silicon layer 110 can be deposited to a thickness of 100~250 Å at a temperature of 500~550° C. under a pressure of 1~2 Torr. The amorphous silicon layer 110 can be formed as the stack of a doped silicon layer and an undoped silicon layer or as an undoped silicon layer, and it is preferred that the P concentration of the doped silicon layer be controlled below 2.0E20 atoms/acc.

The etching process for forming the amorphous silicon spacers 110-1 can be implemented as an anisotropic etching process.

Figure 3E:
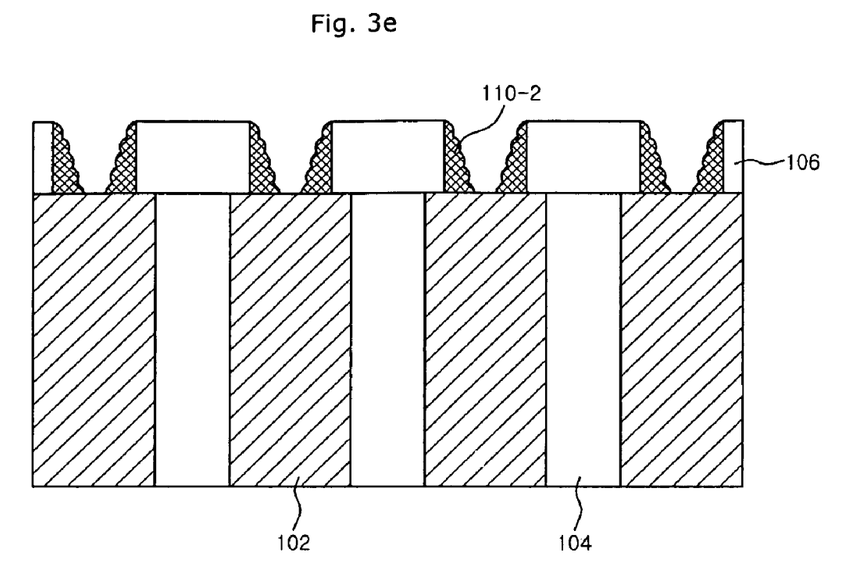

Next, by implementing an MPS (meta-stable polysilicon) process for growing the amorphous silicon spacers 110-1 to hemispherical shape, hemispherical polysilicon spacers 110-2 on the surfaces thereof as shown in FIG. 3e are formed, such that inner sidewalls of the spacers 110-2 have an embossed shape.

In order to form the hemispherical polysilicon spacers 110-2, by heating the resultant structure at a temperature of 550~750° C. for 30~40 seconds while supplying a silicon-based source gas, silicon seeds are formed on the surfaces of the amorphous silicon spacers 110-1. Thereafter, by implementing an annealing process for 40~50 seconds, the amorphous silicon spacers 110-1 are converted into the hemispherical polysilicon spacers 110-2 on the surfaces thereof.

Figure 3F:
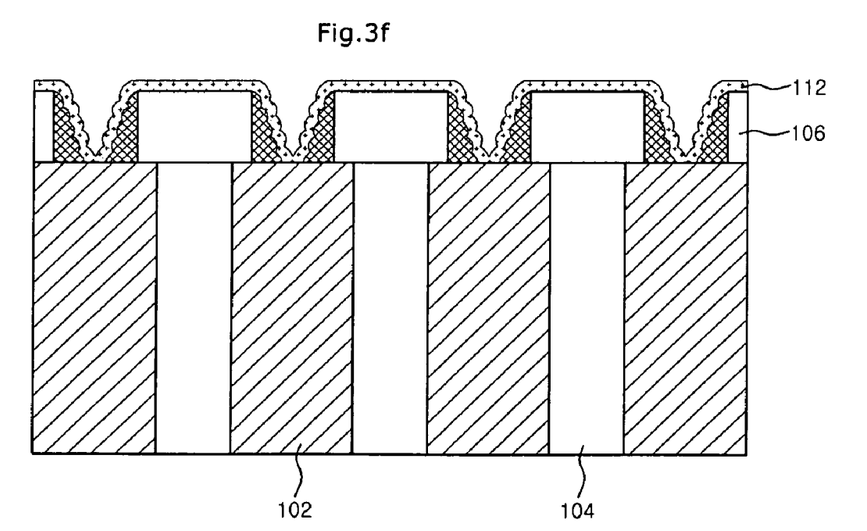
Figure 3G:
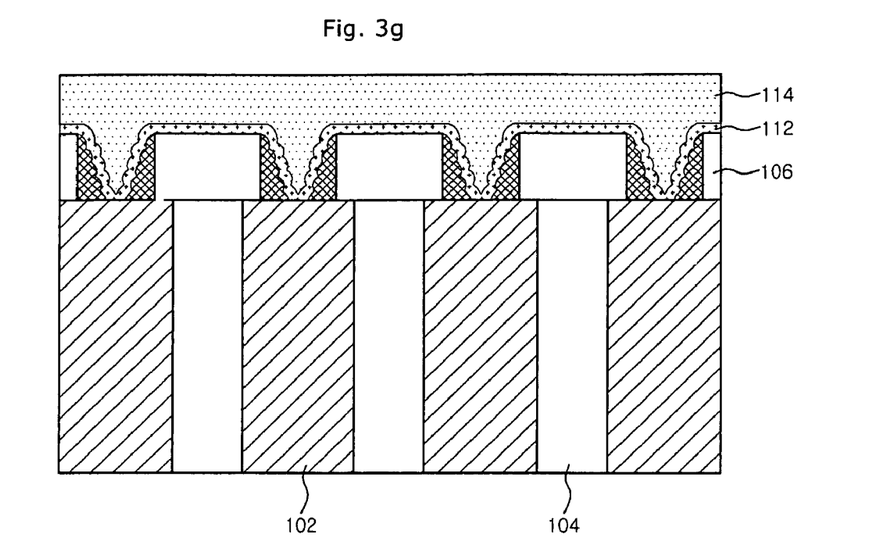

In this way, by forming, on the inner sidewalls of the BEC holes, the hemispherical polysilicon spacers 110-2 on the surfaces thereof, the surface area, that is, the substantial height, of the sidewall of each BEC hole is increased. In this state, as shown in FIGS. 3f and 3g, a conductive material layer 112 and a dielectric material layer 114 are sequentially formed on the resultant entire structure. Here, the conductive material layer 112 can be formed using, for example, titanium nitride (TiN).

Figure 3H:
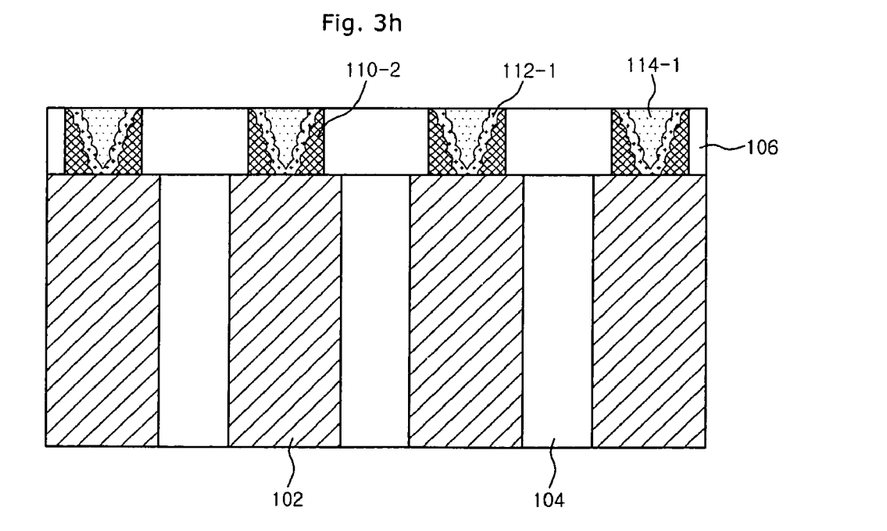

Referring to FIG. 3h, thereafter, by removing the dielectric material layer 114 and the conductive material layer 112 until the surface of the insulation layer 106 is exposed, BECs, in which the BEC holes are filled with the hemispherical polysilicon spacers 110-2, the conductive material layer 112-1 and the dielectric material layer 114-1, are formed.

Figure 3I:
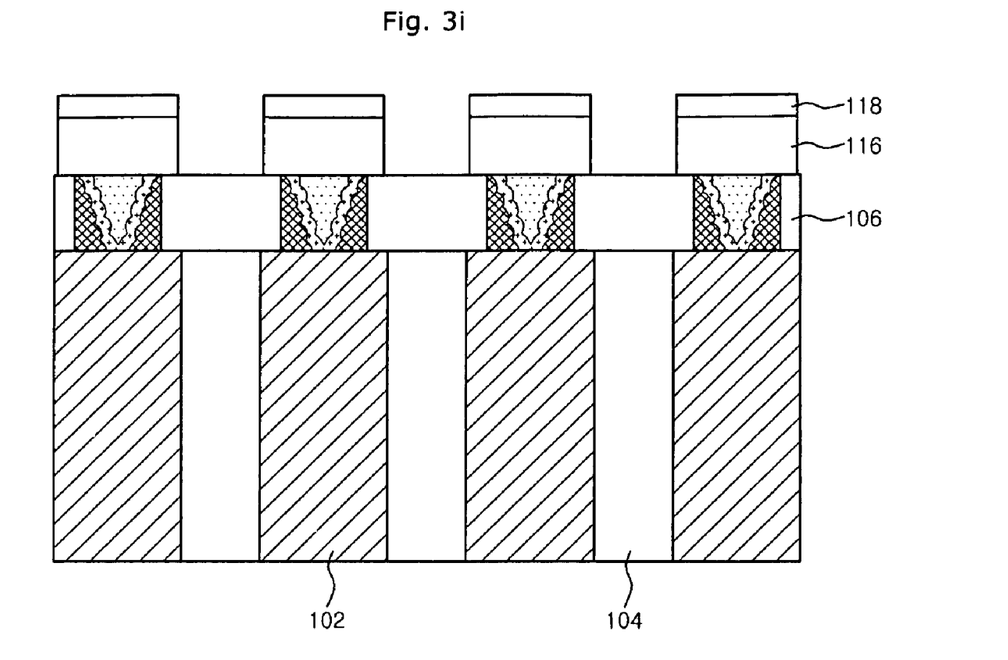

Referring to FIG. 3i, a phase change material layer 116 and top electrodes 118 are sequentially formed on the BECs.

The phase change memory device according to the present invention, formed in this way, includes the bottom electrodes formed on the semiconductor substrate, the bottom electrode contacts (BECs) having the cylinder-shaped hemispherical spacers extending upward from the bottom electrodes and the conductive material layer formed on the surfaces of the spacers and coming into contact with the bottom electrodes, and the phase change material layer formed on the bottom electrode contacts (BECs). It is preferred that a dielectric material layer be interposed between conductive material layers.

In the phase change memory device according to the present invention, by applying the conductive material layer in a state in which the surface area of the inner sidewall of each BEC hole is increased by the hemispherical polysilicon spacer, the effect of increasing the substantial height of the BEC can be accomplished without increasing the aspect ratio of the BEC, and the contact area between the BEC and the phase change material layer can be reduced.

In the above description, it was explained that the hemispherical polysilicon spacers 110-2 are formed through growing the amorphous silicon spacers 110-1 formed on the inner sidewalls of the BEC holes defined in the insulation layer 106. However, the present invention is not limited to this specific configuration. Instead, it can be envisaged that the conductive material layer 112 and the dielectric material layer 114 are directly formed on the amorphous silicon spacers 110-1, and then, after removing the conductive material layer 112 and the dielectric material layer 114 until the surface of the insulation layer 106 is exposed and thereby forming BECs, the phase change material layer 116 and the top electrodes 118 are sequentially formed on the BECs.

Even in this case, since it is possible to increase the substantial height of the BECs due to the presence of the amorphous silicon spacers 110-1 formed on the sidewalls of the BEC holes defined in the insulation layer 106, the reset current can be resultantly decreased.

Figure 4:
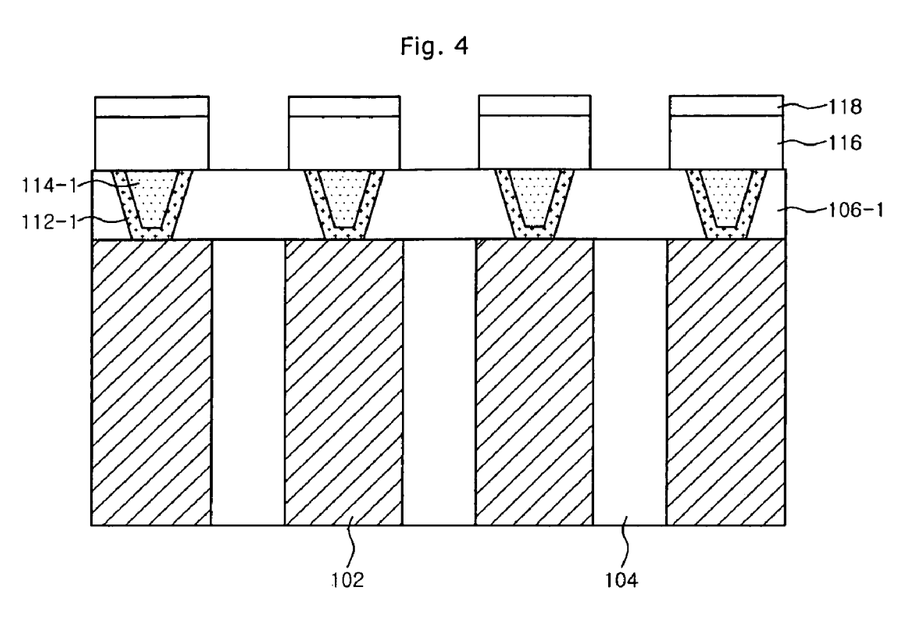
FIG. 4 is a sectional view explaining a method for manufacturing a phase change memory device in accordance with another embodiment.

FIG. 4 is a sectional view explaining a method for manufacturing a phase change memory device in accordance with another embodiment.

FIG. 4 illustrates a phase change memory device in which BECs are formed by slopingly etching an insulation layer 106-1 and then by filling the insides of BEC holes with a conductive material layer 112-1 and a dielectric material layer 114-1. That is, the conductive material layer 112-1 is formed on sidewall and lower portion of the dielectric material layer 114-1. After the BECs are formed, a phase change material layer 116 and top electrodes 118 are sequentially formed on the BECs.

In the present embodiment, without forming spacers in BEC holes or without forming hemispherical protuberances after forming spacers, the effect of increasing the substantial height of the BEC holes can be accomplished due to the presence of the insulation layer 106-1 which is slopingly etched.

As is apparent from the above description, in the present invention, by accomplishing the effect of increasing the height of a BEC without changing the definition of a process for forming the BEC, reset current can be minimized, and according to this, the lifetime, the sensing margin and the shrinkage rate of a phase change memory device can be increased.

Further, due to the fact that a spacer is formed on the sidewall of each BEC hole, the surface of the spacer is formed to have hemispherical protuberances and then a conductive material is filled in the BEC hole, the effects of increasing the height of the BEC and decreasing the critical dimension of the BEC can be accomplished. As a consequence, the contact area between the BEC and a phase change material layer can be reduced, and the reset current can be decreased.

In the existing phase change memory device, only when the height of the BEC is secured to 1,000 Å, the reset current can be decreased to 1 mA. However, in the present invention, after setting the height of an insulation layer for forming the BEC to 400 Å, by forming a hemispherical polysilicon spacer on the inner sidewall of each BEC hole, the reset current could be controlled less than 0.8 mA.

As a result, in the embodiments described herein, since the desired height of the BEC can be secured without increasing the size of the phase change memory device, it is possible to manufacture a phase change memory device which can be applied to portable systems such as a PDA, a mobile PC, and so on.

Although specific embodiments have been described for illustrative purposes, those skilled in the art will appreciate that various modifications, additions and substitutions are possible, without departing from the scope and the spirit of the invention as disclosed in the accompanying claims.

What is claimed is:

1. A phase change memory device, comprising:
   a semiconductor substrate;
   bottom electrodes formed on the semiconductor substrate;
   bottom electrode contacts including cylinder-shaped spacers, which extend from the bottom electrodes in a lengthwise direction and a conductive material layer which is formed on surfaces of the spacers and comes into contact with the bottom electrodes; and
   a phase change material layer formed on the bottom electrode contacts,
   wherein inner sidewalls of the spacer have an embossed shape.

2. The phase change memory device according to claim 1, further comprising: a dielectric material layer formed between the conductive material layers.

3. The phase change memory device according to claim 1, further comprising: an insulation layer formed between the bottom electrode contacts and having different diameters on upper ends and lower ends of the bottom electrode contacts.

* * * * *